(12) United States Patent
Javerliac et al.

(10) Patent No.: US 8,031,519 B2
(45) Date of Patent: Oct. 4, 2011

(54) SHARED LINE MAGNETIC RANDOM ACCESS MEMORY CELLS

(75) Inventors: Virgile Javerliac, Grenoble (FR); Neal Berger, Cupertino, CA (US); Kenneth Mackay, St. Martin le Vinoux (FR); Jean-Pierre Nozieres, Le Sappey-en-Chartreuse (FR)

(73) Assignee: Crocus Technology S.A., Grenoble Cedex (FR)

( * ) Notice: Subject to any disclaimer, the term of this patent is extended or adjusted under 35 U.S.C. 154(b) by 191 days.

(21) Appl. No.: 12/485,359

(22) Filed: Jun. 16, 2009

(65) Prior Publication Data
US 2009/0316476 A1 Dec. 24, 2009

Related U.S. Application Data

(60) Provisional application No. 61/073,575, filed on Jun. 18, 2008.

(51) Int. Cl.
*G11C 11/15* (2006.01)
*G11C 7/00* (2006.01)
(52) U.S. Cl. ............ 365/173; 365/189.16; 365/171
(58) Field of Classification Search .......... 365/63, 365/148, 158, 173, 189.07, 189.16, 209, 365/211
See application file for complete search history.

(56) References Cited

U.S. PATENT DOCUMENTS

| | | | |
|---|---|---|---|
| 4,949,039 A | 8/1990 | Grünberg | |
| 5,159,513 A | 10/1992 | Dieny et al. | |
| 5,343,422 A | 8/1994 | Kung et al. | |
| 5,583,725 A | 12/1996 | Coffey et al. | |
| 5,640,343 A | 6/1997 | Gallagher et al. | |
| 5,959,880 A | 9/1999 | Shi et al. | |
| 6,191,973 B1 | 2/2001 | Moyer | |
| 6,269,016 B1 | 7/2001 | Moyer | |
| 6,304,477 B1 | 10/2001 | Naji | |
| 6,317,349 B1 | 11/2001 | Wong | |

(Continued)

FOREIGN PATENT DOCUMENTS

EP 1 225 593 A1 7/2002
(Continued)

OTHER PUBLICATIONS

Prejbeanu et al. "Thermallly assisted MRAM". Published Apr. 6, 2007. Journal of Physics: Condenser Matter, vol. 19, No. 16.*

(Continued)

*Primary Examiner* — Alexander Sofocleous
*Assistant Examiner* — Hai Pham
(74) *Attorney, Agent, or Firm* — Pearne & Gordon LLP

(57) ABSTRACT

A memory unit with one field line; at least two thermally-assisted switching magnetic tunnel junction-based magnetic random access memory cells, each cell comprising a magnetic tunnel junction having an insulating layer disposed between a magnetic storage layer and a magnetic reference layer; wherein a selection transistor is connected to the magnetic tunnel junction; the one field line is used for passing a field current for switching a magnetization of the storage layer of the magnetic tunnel junctions of the cells. A magnetic memory device can be formed by assembling an array of the memory units, wherein at least two adjacent magnetic tunnel junctions of the cells can be addressed simultaneously by the field line. The memory unit and magnetic memory device have a reduced surface area. Magnetic memory devices with an increased density of memory units can be fabricated resulting in lower die fabrication cost and lower power consumption.

14 Claims, 4 Drawing Sheets

U.S. PATENT DOCUMENTS

| | | | |
|---|---|---|---|
| 6,385,082 | B1 | 5/2002 | Abraham et al. |
| 6,532,164 | B2 | 3/2003 | Redon et al. |
| 6,535,416 | B1 | 3/2003 | Daughton et al. |
| 6,603,677 | B2 | 8/2003 | Redon et al. |
| 6,693,822 | B2 | 2/2004 | Ito |
| 6,724,674 | B2 | 4/2004 | Abraham et al. |
| 6,865,105 | B1 * | 3/2005 | Tran ................................ 365/158 |
| 6,950,335 | B2 | 9/2005 | Dieny et al. |
| 6,954,375 | B2 | 10/2005 | Ohmori |
| 6,963,098 | B2 | 11/2005 | Daughton et al. |
| 7,012,832 | B1 | 3/2006 | Sin et al. |
| 7,129,555 | B2 | 10/2006 | Nozieres et al. |
| 7,310,265 | B2 | 12/2007 | Zheng et al. |
| 7,518,897 | B2 | 4/2009 | Nozieres et al. |
| 7,684,234 | B2 * | 3/2010 | Ho et al. ........................ 365/158 |
| 2002/0057593 | A1 | 5/2002 | Hidaka |
| 2003/0012063 | A1 | 1/2003 | Chien |
| 2004/0095801 | A1 | 5/2004 | Stipe |
| 2004/0160809 | A1 | 8/2004 | Lin et al. |
| 2005/0002228 | A1 | 1/2005 | Dieny et al. |
| 2005/0195658 | A1 | 9/2005 | Sousa et al. |
| 2006/0291276 | A1 | 12/2006 | Nozieres et al. |
| 2008/0084724 | A1 * | 4/2008 | Nozieres et al. .................. 365/50 |
| 2008/0151596 | A1 * | 6/2008 | Fontana et al. ................. 365/130 |
| 2008/0151614 | A1 * | 6/2008 | Guo ................................ 365/171 |

FOREIGN PATENT DOCUMENTS

| | | | |
|---|---|---|---|
| EP | 1 321 943 | A | 6/2003 |
| EP | 1 507 266 | A | 2/2005 |
| EP | 1 580 748 | A | 9/2005 |
| EP | 2 109 111 | A1 | 10/2009 |
| FR | 2 817 998 | A1 | 6/2002 |
| FR | 2 817 999 | A1 | 6/2002 |
| FR | 2 829 867 | A1 | 3/2003 |
| FR | 2 829 868 | A1 | 3/2003 |
| FR | 2 832 542 | A1 | 5/2003 |
| WO | WO 03/025942 | A2 | 3/2003 |
| WO | WO 03/025946 | A1 | 3/2003 |
| WO | WO 03/043017 | A2 | 5/2003 |
| WO | WO 2005/036559 | A1 | 4/2005 |
| WO | WO 2005/086171 | A1 | 9/2005 |
| WO | WO 2008/010957 | A2 | 1/2008 |
| WO | WO 2008/040561 | A3 | 4/2008 |

OTHER PUBLICATIONS

Zhao et al. "TAS-MRAM based Non-volatile FPGA logic circuit". Published by Field-Programmable Technology, 2007, ICFPT 2007, International Conference. Date Dec. 12-14, 2007. pp. 153-160.*
US, Notice of Allowance and Fees Due, Jan. 2, 2009.
EPO, International Search Report, Apr. 10, 2008.
PCT International Search Report, PCT Application No. PCT/EP2009/057546, Oct. 19, 2009.
EP Search Report, Application No. 09160167.4-1233, Aug. 28, 2009.
Purnama, Budi, et al., "Micromagnetic Simulation of Thermally Assisted Magnetization Reversal in Magnetic Nanodots with Perpendicular Anisotropy," Journal of Magnetism and Magnetic Materials, 310 (2007) pp. 2683-2685.
EP Search Report, Application No. 09157306.3-2210, Aug. 25, 2009.
EP Search Report, Application No. 07 818 777.0-2210, Aug. 4, 2009.
US, Office Action, U.S. Appl. No. 11/869,632, Jan. 14, 2009.
US, Notice of Allowance, U.S. Appl. No. 11/869,632, Jan. 2, 2009.
US, Notice of Allowance, U.S. Appl. No. 12/348,830, Oct. 19, 2009.
US, Office Action, U.S. Appl. No. 12/422,742, Oct. 20, 2009.

* cited by examiner

SHARED LINE MAGNETIC RANDOM ACCESS MEMORY CELLS

CROSS-REFERENCE TO RELATED APPLICATIONS

This application claims priority to U.S. provisional patent application Ser. No. 61/073,575, filed on Jun. 18, 2008. Priority to the United States provisional application is expressly claimed, and the disclosure of which is hereby incorporated herein by reference in its entirety.

FIELD

The present disclosure relates to a magnetic random access memory (MRAM) and, more particularly, to magnetic tunnel junction (MTJ)-based memory cells.

BACKGROUND

Thermally-assisted switching magnetic tunnel junction (TAS-MTJ) based magnetic random access memory (MRAM) cells have been described in U.S. Pat. No. 6,950,335 and U.S. Patent Application Publication No. US 2006/0291276 A1 while single-line (SL) TAS-MTJ-based MRAM cells have been described in the co-pending U.S. patent application "SYSTEM AND METHOD FOR WRITING DATA TO MAGNETORESISTIVE RANDOM ACCESS MEMORY CELLS," Ser. No. 12/418,747, filed Apr. 6, 2009, which is assigned to the assignee of the present application and the disclosure of which is hereby incorporated herein by reference in its entirety and for all purposes. These typical implementations use one dedicated conductor field line per bit line or per word line.

FIG. 1a shows an implementation of a conventional TAS-MTJ based MRAM cell 1. As illustrated in FIG. 1a, the cell 1 comprises a magnetic tunnel junction 2 formed from an insulating layer 22 disposed between a reference layer 23, having a fixed magnetization, and a storage layer 21, having a magnetization which direction is adjustable at a threshold temperature. The magnetic tunnel junction 2 is placed between a selection CMOS transistor 3 and a bit line 4, represented parallel to the page and connecting the magnetic tunnel junction 2. Also orthogonal with the bit line 4, a field line 5 is placed underneath the magnetic tunnel junction 2. This configuration includes a strap 7 between the bottom of the magnetic tunnel junction 2 and the selection transistor 3.

The writing of the TAS-MTJ-based MRAM cell 1 is performed by heating the magnetic tunnel junction 2 with a heating current 31 that passes through the magnetic tunnel junction 2 via the bit line 4. This is achieved when the transistor 3 is in a conducting mode (ON). Simultaneously (or after a short time delay) and once the magnetic tunnel junction 2 has reached the suitable temperature threshold, a field current 51 is passed through the field line 5, producing a magnetic field 52 capable of addressing the magnetic tunnel junction 2 by switching the magnetization of the storage layer 21, into the appropriate direction. The heating current 31 then is turned off by setting the selection transistor 3 in a cutoff mode (OFF) or by removing the transistor's source-drain bias. The field current 51 is maintained during the cooling of the magnetic tunnel junction 2 and switched off when the magnetic tunnel junction 2 has reached a predetermined temperature, wherein the magnetization of the storage layer is frozen in the written state.

FIG. 1b illustrates a SL-TAS-MTJ-based MRAM cell 10, where the magnetic tunnel junction 2 is disposed between the selection transistor 3 and the field line 5. The field line 5 is shown as being electrically connected to the magnetic tunnel junction 2 on the side of the storage layer (not shown in FIG. 1b). A control current line (not shown) can be used to control the opening and the closing of the transistor 3 in order to address the SL-TAS-MTJ-based MRAM cell 10 individually. The field line 5 of the SL-TAS-MTJ-based MRAM cell 10 can fulfill several MRAM operational functions. First, the field line 5 can fulfill a function of a bit line by passing the heating current 31. The field line 5 likewise can fulfill a function of a field line by passing the field current 51 to produce the magnetic field 52 capable of switching the magnetization of the storage layer in the magnetic tunnel junction 2.

FIG. 2a represents two adjacent TAS-MTJ-based MRAM cells 1 and FIG. 2b represents two adjacent SL-TAS-MTJ-based MRAM cells 10. As shown in FIGS. 2a and 2b, each adjacent TAS-MTJ-based MRAM or SL-TAS-MTJ-based MRAM cell are addressed by a separate field line 5.

A magnetic memory device (not shown) can be formed by assembling an array comprising a plurality of the TAS-MTJ-based MRAM cell 1 or SL-TAS-MTJ-based MRAM cell 10. The array of cells 1, 10 can be disposed within a device package (not shown). When forming the magnetic memory device, the magnetic tunnel junction 2 can be connected on the side of the storage layer 21 to the bit line 4 and on the opposite side to the field line 5, in the case of the TAS-MTJ-based MRAM cell 1. The magnetic tunnel junction 2 is connected on the side of the storage layer 21 to the field line 5, in the case of the SL-TAS-MTJ-based MRAM cell 10. In the case of the TAS-MTJ-based MRAM cell 1, the field line 5 is preferably placed perpendicularly with reference to the bit line 4.

The magnetic memory device usually comprises a current driver (not represented) placed at each extremities of the field line 5 to control the direction of the field current 51. The current driver comprises two or more control transistors (not shown) depending on their configuration. In order to generate a magnetic field 52 able to switch the magnetization of the storage layer 21 in all the magnetic tunnel junctions 2 along the field line 5, the intensity of the field current 51 must be in the order of 10 mA or more. Consequently, current drivers having a large size must be used increasing the surface area of the memory cell array. Since the thickness of the field line 5 cannot be easily increased due to fabrication process limitations, the width of the field line 5 is restricted by the time-to-failure limit of the metallic field line 5 due to electromigration. Moreover, the use of a narrow field line 5 with a high sheet resistance may cause the intensity of the magnetic field 52 to decrease along the field line 5 due to ohmic drop, limiting the number of memory cells 1, 10 being adequately addressed along the field line 5.

In order to minimize the ohmic drop effect along the field line 5, the magnetic memory device can be segmented in sub-arrays (not shown), each sub-array comprising a smaller number of memory cell. This configuration, however, requires an additional driver transistor for every additional field line 5 to drive the current to the appropriate field line 5 for each sub-array. This results in an increased magnetic memory device size and circuit complexity.

SUMMARY

The present application discloses a system and method which overcomes at least some limitations of the prior art. One embodiment comprises a thermally-assisted switching magnetic tunnel junction-based magnetic random access memory cell array having a reduced memory cell array size without increasing the array complexity while obtaining good performances in writing selectivity and reliability.

According to the embodiments, a memory unit can comprise one field line; at least two thermally-assisted switching magnetic tunnel junction-based magnetic random access memory cells, each cell comprising a magnetic tunnel junction having an insulating layer disposed between a magnetic storage layer and a magnetic reference layer; wherein a selection transistor is electrically connected to said magnetic tunnel junction; characterized in that said one field line is used for passing at least a field current for switching a magnetization of the storage layer of the magnetic tunnel junctions of said cells.

In an embodiment, said one field line is electrically connected to the magnetic tunnel junctions of said cells, said one field line further passing a heating current for heating the magnetic tunnel junctions of said cells.

In another embodiment, each cell further comprises a bit line electrically connected to the magnetic tunnel junctions of said cells, the bit line passing the heating current for heating the magnetic tunnel junctions of said cells.

In yet another embodiment, a magnetic memory device is formed by assembling an array comprising a plurality of the memory units.

The disclosure also pertains to a method for writing the memory unit comprising heating the magnetic tunnel junctions of said cells to a high temperature threshold;

switching the magnetization of the storage layer of the magnetic tunnel junctions; and cooling the magnetic tunnel junctions to a low temperature threshold at which the magnetization of the ferromagnetic storage layer is frozen in the written state.

The disclosed memory unit and magnetic memory device have a reduced surface area. Magnetic memory devices with an increased density of memory units can be fabricated resulting in a lower die fabrication cost. Lower power consumption can also be achieved without increasing the complexity of the memory unit and/or magnetic memory device fabrication and configuration.

BRIEF DESCRIPTION OF THE DRAWINGS

The preferred embodiments will be better understood with the aid of the description of an embodiment given by way of example and illustrated by the figures, in which:

FIG. 2a illustrates two adjacent memory cells of the FIG. 1a;

DETAILED DESCRIPTION OF THE PREFERRED EMBODIMENTS

Figure 3A:
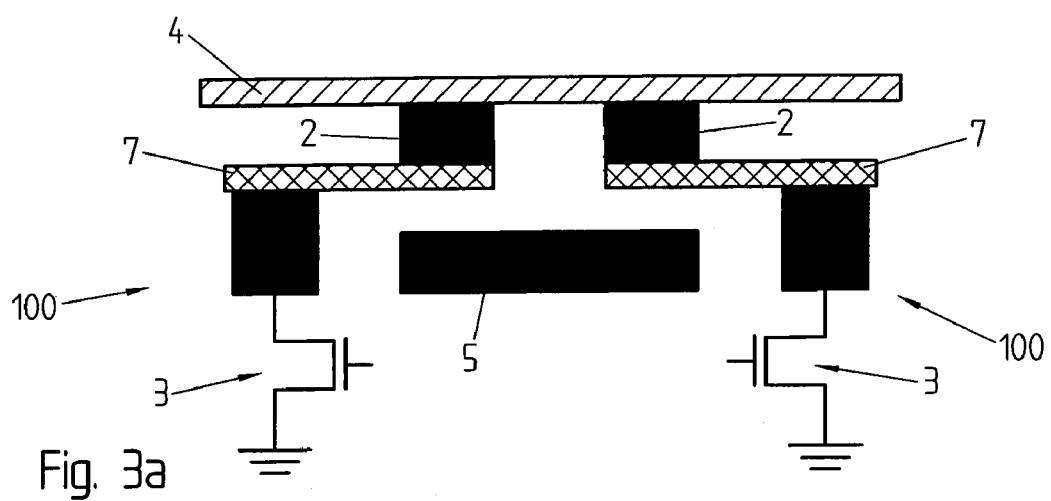
FIG. 3a represents a memory unit comprising two thermally-assisted switching magnetic tunnel junctions-based magnetic random access memory cells comprising a field line, according to an embodiment.

FIG. 3a shows a memory unit comprising two thermally-assisted switching magnetic tunnel junctions (TAS-MTJ)-based magnetic random access memory (MRAM) cells 100 according to an embodiment. Each TAS-MTJ-based MRAM cell 100 comprises a magnetic tunnel junction 2, a selection CMOS transistor 3 and a strap 7. The selection transistor 3 is electrically connected to the bottom of the magnetic tunnel junction 2 via the strap 7 and can be controlled by a word line (not represented). In the memory unit configuration of FIG. 3a, the two straps 7 and selection transistors 3 of the two adjacent MTJ-based MRAM cells 100 are disposed in a mirror-like fashion. The memory unit further comprises a bit line 4, represented parallel to the page in FIG. 3a, electrically connected to each magnetic tunnel junctions 2. A field line 5, substantially orthogonal with the bit line 4, is placed underneath the two adjacent magnetic tunnel junctions 2, between the selection transistors 3.

Although not represented in FIG. 3a, the each magnetic tunnel junction 2 is formed from an insulating layer disposed between a reference layer, having a fixed magnetization, and a storage layer, having a magnetization which direction is adjustable at a threshold temperature. Alternatively, the reference layer can have a magnetization that is adjustable relative to said magnetization of the storage layer During a write operation, the field line 5 is able to address simultaneously the two adjacent magnetic tunnel junctions 2. More particularly, a field current (not represented) is passed along the field line 5 generating a magnetic field (also not represented) able to switch the storage layer magnetization of the two adjacent magnetic tunnel junctions 2 in a direction according to the field current.

In an embodiment, the write operation comprises heating the magnetic tunnel junctions 2 with a heating current (not shown) passing through the magnetic tunnel junctions 2 via the first bit line 4 when the selection transistors 3 are in a closed mode, or conducting mode. Simultaneously or after a short time delay, once the magnetic tunnel junctions 2 have reached a high temperature threshold at which the magnetization of the storage layer can be adjusted, a field current (not shown) is passed through the field line 5 to generate a magnetic field (not shown) capable of switching the magnetization of the storage layer of the two adjacent magnetic tunnel junctions 2. The heating current then is turned off by setting the selection transistors 3 in a cutoff mode or by removing the transistor's source-drain bias. The field current is maintained during the cooling of the magnetic tunnel junctions 2 and switched off when the junctions 2 have reached a low temperature threshold, where the magnetization of the storage layer is frozen in the written state.

In another embodiment, the write operation is performed sequentially for one and the other magnetic tunnel junction 2. This can be performed, for example, by sequentially heating one and the other junction 2 to the high temperature threshold and cooling one and the other junction 2 to the low temperature threshold, while passing the field current in the field line 5.

During a read operation, at least one or the two selection transistors 3 can be set in the closed mode, or conducting mode, and a sense current (not shown) can be passed through at least one of the magnetic tunnel junctions 2 via the bit line 4. A voltage across the magnetic tunnel junctions 2 thereby can be measured. The voltage measurement can yield a corresponding resistance R of the magnetic tunnel junctions 2. If the magnetization orientation of the storage layer imposed by the magnetic field is parallel to the magnetization direction of the reference layer, the measured junction resistance R has a low resistance value. In contrast, if the magnetization direction of the storage layer is antiparallel to the magnetization direction of the reference layer, a high junction resistance R can be measured.

Figure 3B:
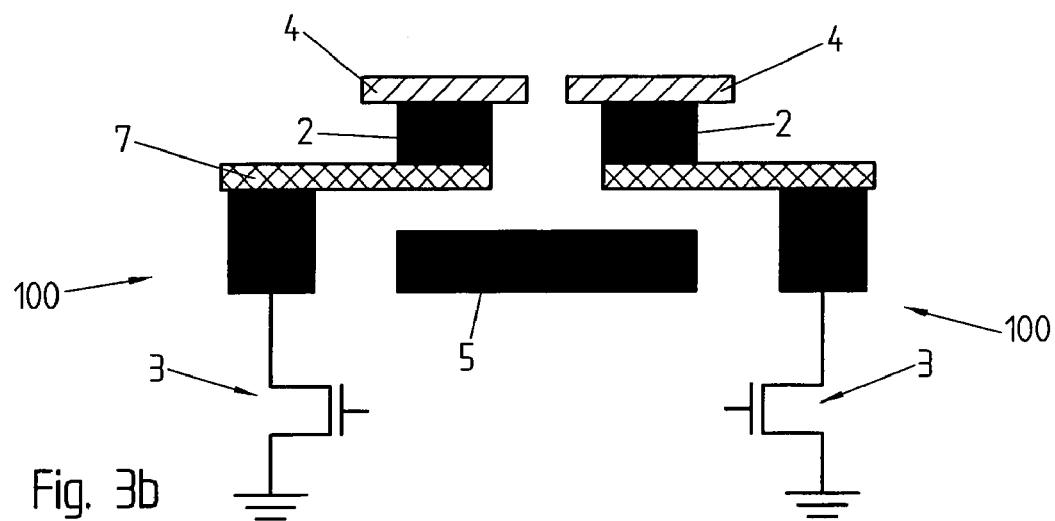
FIG. 3b represents the memory unit according to another embodiment.

In another embodiment illustrated in FIG. 3b, the bit line 4 is disposed substantially parallel with the field line 5. In FIG. 3b, the two bit lines are represented entering the page, each bit line 4 being electrically connected to the magnetic tunnel junctions 2 of the two TAS-MTJ-based MRAM cells 100.

In the memory unit configurations of FIGS. 3a and 3b, the selection transistors 3 being connected, for example through a via, to the silicon substrate (not shown), extending the field line 5 width beyond the two transistors 3 is prevented. Consequently, the field line 5 can only address simultaneously two adjacent TAS-MTJ-based MRAM cells 100.

Figure 5A:
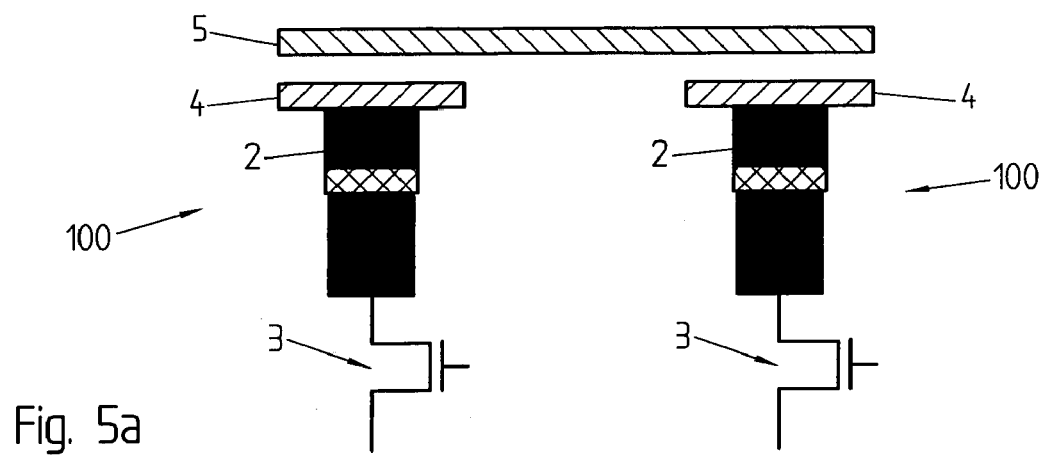
FIG. 5a shows the memory unit according to yet another embodiment.

In yet another embodiment shown in FIG. 5a, the magnetic tunnel junctions 2 of each TAS-MTJ-based MRAM cell 100 of the memory unit are arranged in a stacked geometry where the selection transistor 3 is connected directly below the magnetic tunnel junction 2 without the use of the strap 7. Moreover in the configuration of FIG. 5a, the field line 5 is disposed above the two adjacent magnetic tunnel junctions 2, substantially parallel to the bit lines 4, electrically connected to the junctions 2. The field line 5 is able to address simultaneously the two adjacent magnetic tunnel junctions 2. More particularly, when the field current is passed along the field line 5, the induced magnetic field is able to switch the magnetization of the storage layer of the two adjacent magnetic tunnel junctions 2. The field line 5 needs not overlap the two adjacent junctions 2 as illustrated in FIG. 5a but can be narrower. For example, a narrow field line 5 can be placed between the two adjacent magnetic tunnel junctions 2.

Figure 5B:
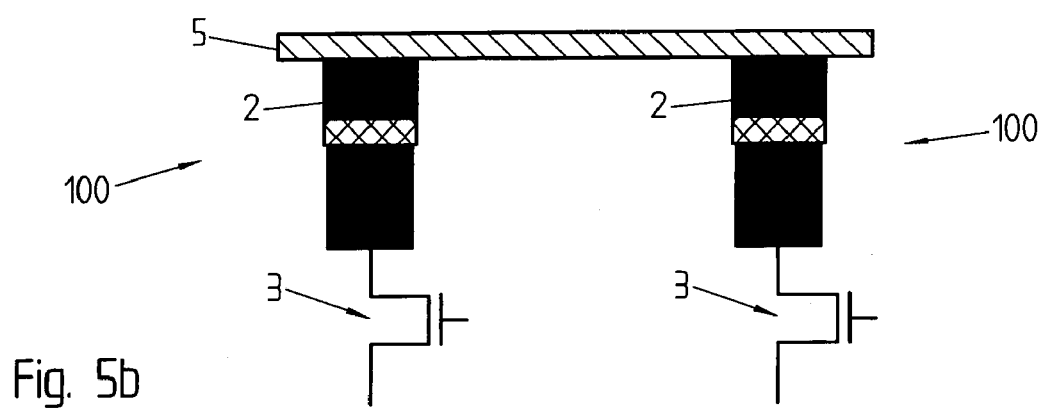
FIG. 5b illustrates the memory unit according to yet another embodiment.

In a preferred embodiment shown in FIG. 5b, the field line 5, represented entering the page, is placed above the two adjacent magnetic tunnel junctions 2 and is electrically connected the two junctions 2. In the configuration of FIG. 5b, the field line 5 can fulfill a first function for passing the heating current for heating the junction, and a second function for passing the field current for switching the magnetization of the storage layer of the magnetic tunnel junctions 2. Similarly to the configuration of FIG. 5a, the field line 5 in the configuration of FIG. 5b needs not overlap the two adjacent junctions 2 but can be narrower as long as the magnetization of the storage layer can be switched when the field current is passed in the field line 5.

In the memory unit configurations of FIGS. 5a and 5b, the field line 5 is disposed above the magnetic tunnel junctions 2 and its width can be increased allowing the field line 5 to overlap and address more than two TAS-MTJ-based MRAM cells 100. Moreover, the stacked geometry of the magnetic tunnel junctions 2 allows for decreasing the memory unit surface area.

A magnetic memory device (not shown) can be formed by assembling an array comprising a plurality of the memory units according to any of the embodiments. The array of memory units can be disposed within a device package (not shown). When forming the magnetic memory device, at least two adjacent magnetic tunnel junctions 2 of each memory unit can be addressed with the field line 5. The magnetic tunnel junctions 2 of each memory unit can be connected on the selection transistor side to the word line.

In an embodiment, field line 5 overlaps several TAS-MTJ-based MRAM cells 100 and more than two adjacent magnetic tunnel junctions 2 of can be addressed with the field line 5.

In another embodiment, all magnetic tunnel junctions 2 of the magnetic memory device can be addressed by the field line 5. In this configuration the field line 5 can have, for example, a planar shape. This configuration allows for decreasing the magnetic memory device surface area, thus increasing its density, since only four driver transistors are required for the complete magnetic memory device. Due to their lower surface area, the memory unit configurations of 5a and 5b allows for a further increase in the magnetic memory device density.

In an embodiment, the magnetic memory device comprises several sub-arrays, each sub-array being formed from a plurality of the memory units, and comprising one or several field lines 5. Any other configurations of the magnetic memory device are also possible where the field line 5 address simultaneously at least two adjacent magnetic tunnel junctions 2.

The magnetic memory device has a surface area that depends in part on the surface area of the driver transistors (not shown) controlling the field line 5. Typically, the field line 5 is controlled by four driver transistors placed at both extremities of the field line 5. The surface area $S_D$ of the driver transistors can then be approximated as $4*S_T$, where $S_T$ is the surface area of one driver transistor. With the conventional TAS-MTJ-based MRAM cell configurations, the surface area of the driver transistors corresponds to $4*S_T*NFL$, where nFL is the number of field lines 5 in the magnetic memory device.

Figure 1A:
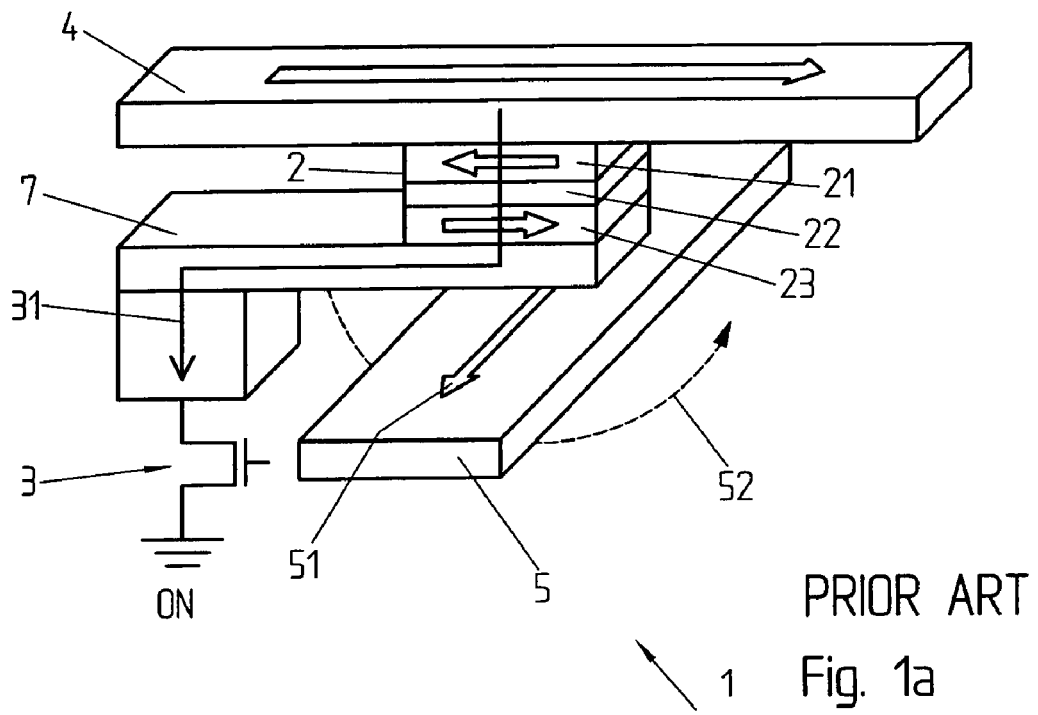
FIG. 1a shows a conventional thermally-assisted switching magnetic tunnel junction-based magnetic random access memory cell.
Figure 1B:
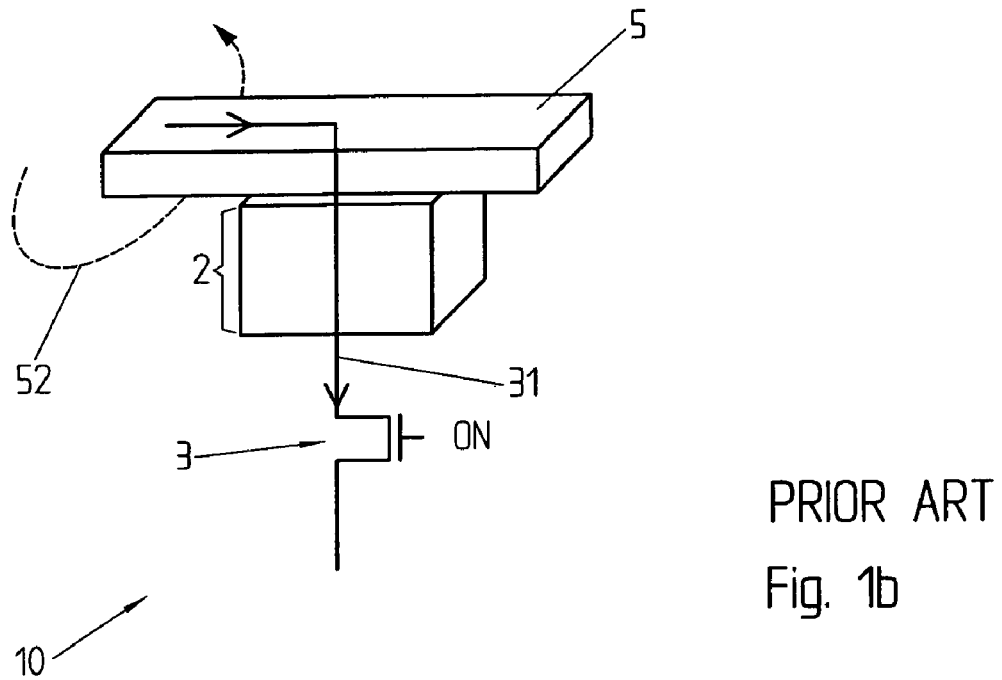
FIG. 1b shows another conventional thermally-assisted switching magnetic tunnel junction-based magnetic random access memory cell.
Figure 2A:
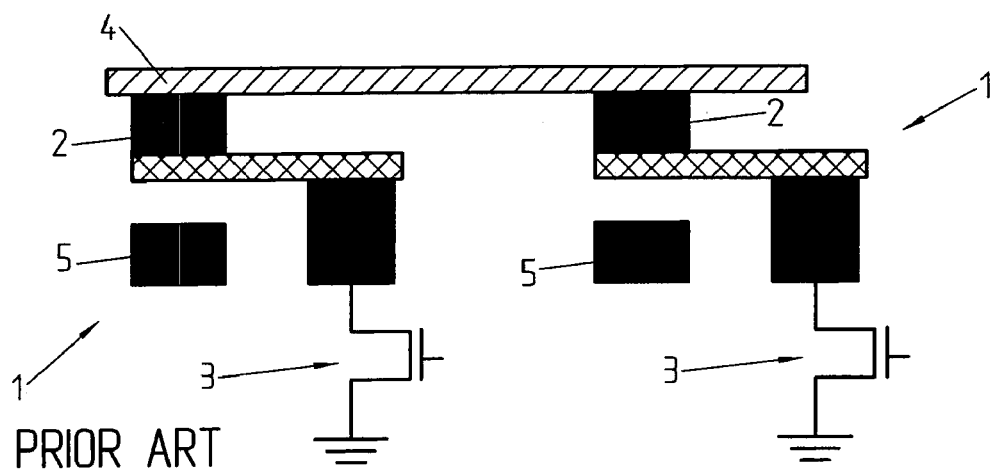
Figure 2B:
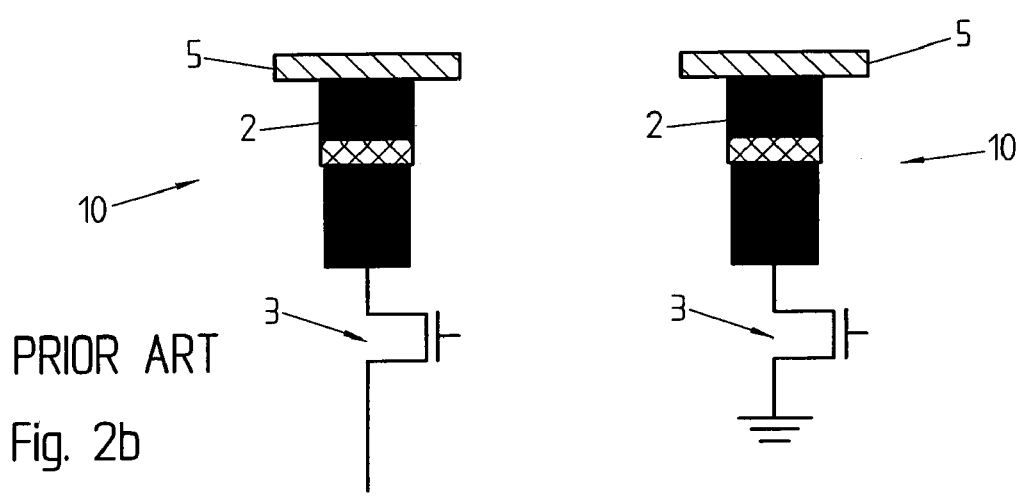
FIG. 2b illustrates two adjacent memory cells of the FIG. 1b.

Using the memory unit configurations of FIGS. 3a, 3b, 5a and 5b, however, each field line 5 is shared between two adjacent TAS-MTJ-based MRAM cells 100 and the magnetic memory device comprises half the number of field lines 5 (nFL/2) that is used in the conventional TAS-MTJ-based MRAM cell configurations, such as the one of FIG. 2a.

Moreover, using the memory unit according to any embodiment disclosed herein, the width of the field line 5 and its position relative to the two adjacent magnetic tunnel junctions 2 can yield a distribution of the magnetic field intensity applied on the magnetic tunnel junctions 2 that differs compared to the one applied by the field line 5 in the conventional configuration of FIG. 2a. Indeed, the magnetic field, $H_x$, generated by a rectangular conductor can be expressed as set forth in Equation 1:

$$H_x(x, z) = \frac{\gamma}{2}\left[(w/2 + x)\ln\left(1 + \frac{t^2 + 2zt}{(w/2 + x)^2 + z^2}\right) + \right.$$
$$2(z + t)\arctan\left(\frac{w/2 + x}{z + t}\right) - 2z\arctan\left(\frac{w/2 + x}{z}\right)\bigg] -$$
$$\frac{\gamma}{2}\left[(-w/2 + x)\ln\left(1 + \frac{t^2 + 2zt}{(-w/2 + x)^2 + z^2}\right) + \right.$$
$$2(z + t)\arctan\left(\frac{-w/2 + x}{z + t}\right) - 2z\arctan\left(\frac{-w/2 + x}{z}\right)\bigg]. \quad \text{(Equation 1)}$$

In Equation 1, γ is a factor proportional to the field current density, x is the offset from the center of the field line 5, z the distance above the field line 5, and w and t, the width and thickness of the field line 5, respectively.

Figure 4A:
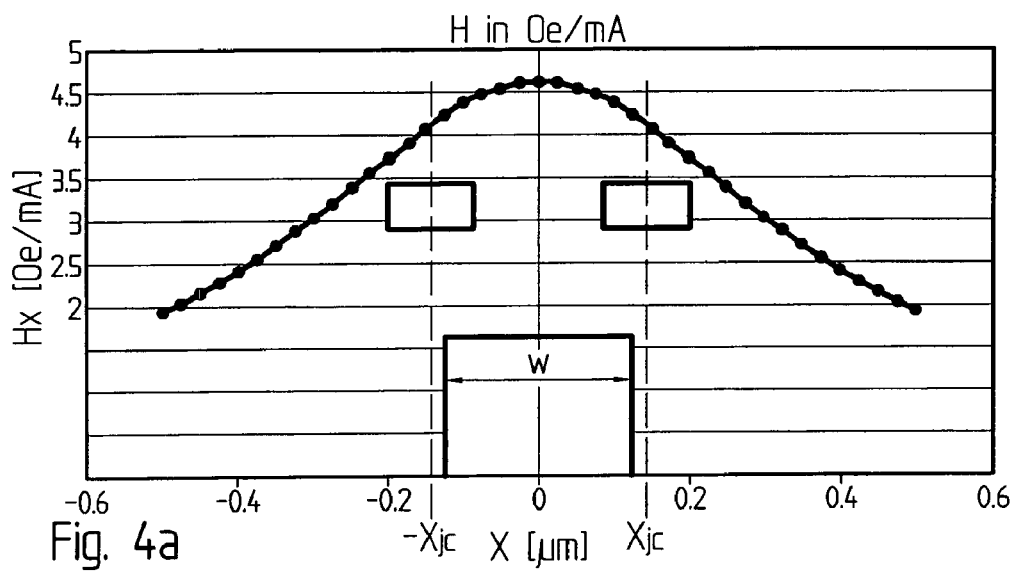
FIG. 4a graphically represents the magnetic field generated by the field line for a first field line width.
Figure 4B:
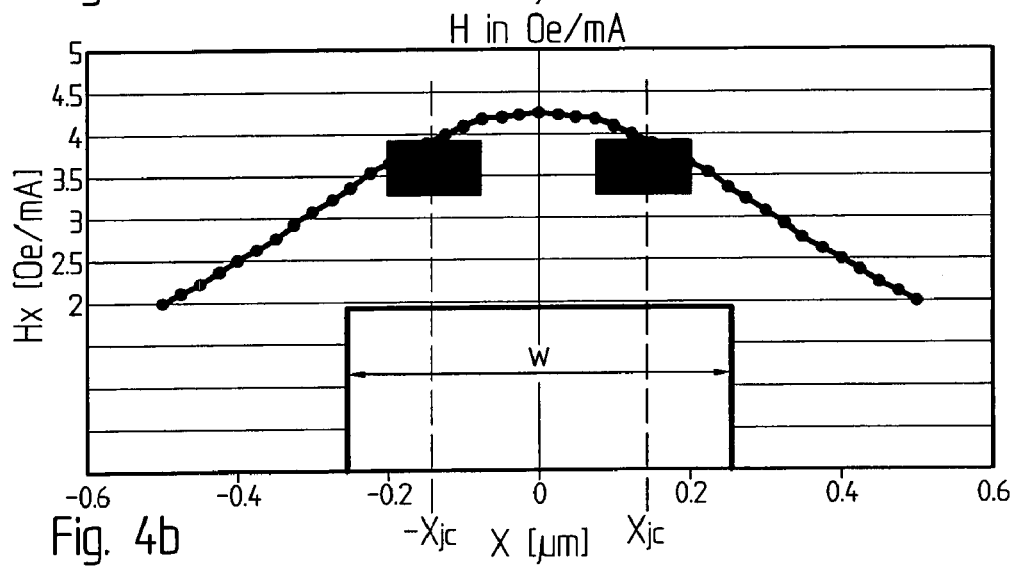
FIG. 4b graphically represents the magnetic field generated by the field line for a second field line width.
Figure 4C:
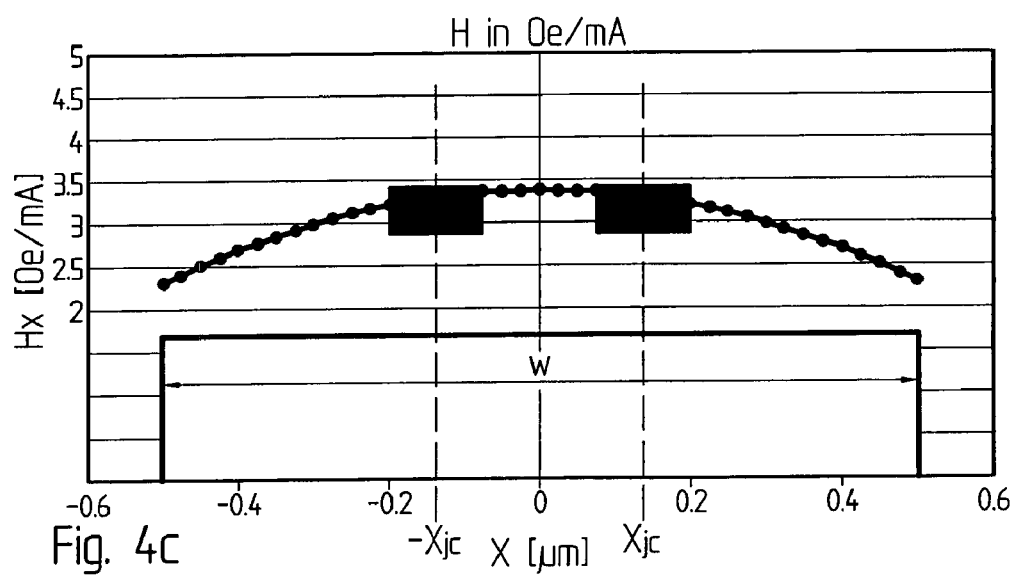
FIG. 4c graphically represents the magnetic field generated by the field line for a third field line width.

The variation of the magnetic field with the offset x, calculated with Equation 1, is shown in the graphs of FIGS. 4a to 4c for three different field line widths w corresponding to w=0.24 μm, w=0.48 μm, and w=0.96 μm, respectively. In this example, the calculations assume a field line thickness of t=0.46 μm and a distance of z=0.23 μm between the top surface of the field line 5 and the bottom of the junction 2. In FIGS. 4a to 4c, the two adjacent junctions 2 and the field line 5, according to the memory unit configurations of FIGS. 3a and 3b, are also represented by the two rectangles in the upper half the graphs and the rectangle in the lower half of the graphs, respectively.

As can be seen in FIGS. 4a to 4c, the magnetic field generated by the field line 5 is maximum at the field line center (x=0) and decreases with increasing or decreasing x. The magnetic field distribution is most non uniform along the distance x for the narrower field line 5 (w=0.24 μm, FIG. 4a) and becomes more uniform as the shared field line width is increased (w=0.48 μm, FIG. 4b, and w=0.96 μm, FIG. 4c).

In the configuration of the memory unit according to any embodiment disclosed herein, the magnetic field applied by the field line 5 at the center of the magnetic tunnel junctions 2 corresponds to the values calculated at $x=x_{jc}$ and $-x_{jc}$, respectively. In contrast, in the conventional TAS-MTJ-based MRAM cell configuration the field line 5 is centered below the junctions 2, and the magnetic field applied at the center of the magnetic tunnel junction corresponds to the value calculated at x=0. In the example of FIG. 4b where the field line width of w=0.48 μm is approximately twice the field line width in the conventional TAS-MTJ-based MRAM cell configuration, the magnetic field intensity measured at the center of the magnetic tunnel junctions 2 is about 15% lower than the one estimated by comparing the magnetic field value at x=0 in FIG. 4a and the magnetic field value at $x=x_{jc}$ or $-x_{jc}$, in FIG. 4b. In this example, the field current required to obtain the same magnetic field intensity at the center of the junctions 2 in the memory unit configuration according to any embodiment disclosed herein, must be about 15% larger than the one required in the conventional TAS-MTJ-based MRAM cell configuration. This results in an increase in the surface area of the driver transistors proportional to the field current increase.

For example, in the case of the memory unit configuration of FIG. 3a and 3b with the field line 5 width being twice the field line width in the conventional TAS-MTJ-based MRAM cell configuration, the surface area of the driver transistors corresponds to $S_D=4*S_T*1.15*nFL/2$, where the value 1.15 represents the 15% increase in the driver transistor surface area $S_T$ due to the increase in field current. The surface area of the driver transistors based on the memory unit configuration is thus smaller than the surface area of a memory cell array based on the conventional TAS-MTJ-based MRAM cell configuration, by a factor of 0.575. Moreover, using a larger field line 5, although requiring an increase in the field current of about 15%, allows for moving away from the electromigration limit and thus, improving the reliability of the TAS-MTJ-based MRAM cells 100 in the memory unit. A wider field line 5 is also characterized by a smaller ohmic drop in the line and a longer field line 5 can be used minimizing the need in segmenting the magnetic memory device, yielding further improved cell efficiency.

The above exemplary calculations illustrate how the surface area of the magnetic memory device can be decreased using the configuration of the memory unit according to any embodiment disclosed herein. The decrease in surface area is proportional to the number of TAS-MTJ-based MRAM cells 100 shared by the same field line 5. It also depends on the width of the field line 5.

In addition to decreasing the surface area of the magnetic memory device, the configuration of the memory unit according to any embodiment disclosed herein allows for further increasing the magnetic memory device density, since the surface area of the memory unit is smaller due to the lower number of driver transistors compared to the conventional TAS-MTJ-based MRAM cells. Moreover, the field line 5 can be widened without impacting on the size and/or geometry of the cell 100. Since the field current passing in the field line 5 is used to switch the storage layer magnetization of at least two adjacent magnetic tunnel junctions 2, the power consumption is reduced. The configuration of the memory unit according to any embodiment disclosed herein also allows for using larger sub-arrays, or lower segmentation of the magnetic memory device. This, in turn, allows for higher density magnetic memory devices and a better margin to the electromigration limit.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

For example, in an embodiment, the field line 5 is made of a conductive material surrounded by magnetic cladding layer (not represented). When the field current is applied through the conductive material of the field line 5, the magnetic field generated by the field current is enhanced by the magnetic cladding layer. The magnetic cladding layer can also shield the addressed magnetic tunnel junctions 2 from possible magnetic fields produced by other field lines, thereby protecting their written information.

REFERENCE NUMBERS AND SYMBOLS

1 TAS-MTJ-based MRAM cell
10 SL-TAS-MTJ-based MRAM cell
100 MTJ-based MRAM cell of the memory unit
2 magnetic tunnel junction
21 storage layer
22 insulating layer
23 reference layer
3 selection transistor
31 heating current
4 bit line
5 field line
51 field current
52 magnetic field
7 strap
$H_x$ magnetic field
$S_D$ driver surface area
$S_T$ driver transistor surface area
nFL number of field lines in the memory cell array

What is claimed is:
1. A memory unit, comprising:
one field line; and
at least two adjacent thermally-assisted switching magnetic tunnel junction-based magnetic random access memory cells, each cell comprising a magnetic tunnel junction having an insulating layer disposed between a magnetic storage layer and a magnetic reference layer,
wherein a selection transistor is electrically connected to said magnetic tunnel junction; and
wherein said one field line is arranged for passing at least a field current such as to simultaneously switch a magne- tization of the storage layer of the magnetic tunnel junctions of said at least two adjacent memory cells.

2. The memory unit according to claim 1, wherein said one field line is electrically connected to the magnetic tunnel junctions of said cells, said one field line further passing a heating current for heating the magnetic tunnel junctions.

3. The memory unit according to claim 1, wherein each cell further comprises a bit line electrically connected to the magnetic tunnel junctions, the bit line passing the heating current for heating the magnetic tunnel junctions.

4. The memory unit according to claim 3, wherein each cell further comprises a strap electrically connected between the magnetic tunnel junctions and the selection transistor of said cells, the field line being underneath the two adjacent magnetic tunnel junctions and between the selection transistors.

5. The memory unit according to claim 3, wherein said one field line is disposed above the magnetic tunnel junctions and the bit line.

6. The memory unit according to claim 3, wherein said one field line is substantially orthogonal with the bit line.

7. The memory unit according to claim 3, wherein said one field line is substantially parallel with the bit line.

8. The memory unit according to claim 1, wherein the field line comprises a magnetic cladding layer.

9. A magnetic memory device formed by assembling an array comprising a plurality of memory units, each memory unit comprising:
    one field line; and
    at least two adjacent thermally-assisted switching magnetic tunnel junction-based magnetic random access memory cells, each cell comprising a magnetic tunnel junction having an insulating layer disposed between a magnetic storage layer and a magnetic reference layer; wherein a selection transistor is electrically connected to said magnetic tunnel junction,
    wherein said one field line is arranged for passing at least a field current such as to simultaneously switch a magnetization of the magnetic tunnel junction storage layer of said at least two adjacent memory cells.

10. The magnetic memory device according to claim 9, wherein more than two adjacent magnetic tunnel junctions of said cells can be addressed simultaneously by the field line.

11. The magnetic memory device according to claim 9, wherein the magnetic memory device comprises several sub-arrays, each sub-array being formed from a plurality of said memory units and comprising one or several field lines.

12. A method for writing to a memory unit comprising one field line; at least two thermally-assisted switching magnetic tunnel junction-based magnetic random access memory cells, each cell comprising a magnetic tunnel junction having an insulating layer disposed between a magnetic storage layer and a magnetic reference layer; wherein a selection transistor is electrically connected to said magnetic tunnel junction; comprising:
    heating the magnetic tunnel junctions of said cells to a high temperature threshold;
    switching the magnetization of the storage layer of the magnetic tunnel junctions; and
    cooling the magnetic tunnel junctions to a low temperature threshold at which the magnetization of the ferromagnetic storage layer is frozen in the written state;
    said switching being performed simultaneously for said at least two adjacent memory cells by a magnetic field generated by passing a field current in the field line.

13. The method according to claim 12, wherein said one field line is electrically connected to the magnetic tunnel junctions of said cells and wherein said heating the magnetic tunnel junctions includes passing a heating current through the magnetic tunnel junctions via the connecting field line when the select transistors are in an open mode.

14. The method according to claim 12, wherein each cell further comprises a bit line electrically connected to the magnetic tunnel junctions of said cells, and wherein said heating the magnetic tunnel junctions includes passing a heating current through the magnetic tunnel junctions via the connecting bit line when the select transistors are in an open mode.

* * * * *

UNITED STATES PATENT AND TRADEMARK OFFICE
CERTIFICATE OF CORRECTION

PATENT NO.          : 8,031,519 B2                           Page 1 of 1
APPLICATION NO.     : 12/485359
DATED               : October 4, 2011
INVENTOR(S)         : Virgile Javerliac et al.

It is certified that error appears in the above-identified patent and that said Letters Patent is hereby corrected as shown below:

In the Specification:

Column 6, line 33: Delete "NFL" and replace with "nFL"

Signed and Sealed this
Tenth Day of January, 2012

David J. Kappos
*Director of the United States Patent and Trademark Office*